(12) United States Patent
Sun et al.

(10) Patent No.: US 9,649,763 B2
(45) Date of Patent: May 16, 2017

(54) MICRO-NANO TOOLS WITH CHANGEABLE TIPS FOR MICRO-NANO MANIPULATION

(76) Inventors: Yu Sun, Toronto (CA); Ko Lun Chen, Mississauge (CA)

(*) Notice: Subject to any disclaimer, the term of this patent is extended or adjusted under 35 U.S.C. 154(b) by 533 days.

(21) Appl. No.: 14/123,633

(22) PCT Filed: Jun. 1, 2012

(86) PCT No.: PCT/CA2012/000508
§ 371 (c)(1),
(2), (4) Date: Dec. 3, 2013

(87) PCT Pub. No.: WO2012/162798
PCT Pub. Date: Dec. 6, 2012

(65) Prior Publication Data
US 2014/0284950 A1    Sep. 25, 2014

Related U.S. Application Data

(60) Provisional application No. 61/493,168, filed on Jun. 3, 2011.

(51) Int. Cl.
*B25J 7/00* (2006.01)
*B25J 15/04* (2006.01)
(Continued)

(52) U.S. Cl.
CPC .............. *B25J 7/00* (2013.01); *B25J 15/04* (2013.01); *B25J 15/0491* (2013.01);
(Continued)

(58) Field of Classification Search
CPC . B25J 7/00; B25J 15/0253; B25J 15/04; B25J 15/12; Y10T 483/17
(Continued)

(56) References Cited

U.S. PATENT DOCUMENTS

| 5,332,275 A | * | 7/1994 | Conway | B25J 7/00 294/100 |
| 5,895,084 A | * | 4/1999 | Mauro | B25J 7/00 294/100 |

(Continued)

FOREIGN PATENT DOCUMENTS

CH        EP 1029637 A1 *  8/2000  ..............  B25J 15/10

OTHER PUBLICATIONS

Bartenwerfer, M. et al, Automated Handling and Assembly of Customizable AFM-Tips, Assembly and Manufacturing, May 2011, p. 1-6, IEEE.

(Continued)

*Primary Examiner* — Erica E Cadugan
*Assistant Examiner* — Michael Vitale
(74) *Attorney, Agent, or Firm* — Eduardo Krupnik; Miller Tromsu LLP

(57) ABSTRACT

The present invention relates to modular system for micro-nano manipulation of samples. The modular system of the present invention comprises changeable tool tips which may be provided in an array, and a tool body. Each changeable tool tip comprises an end effector connected to a base having mating structures. The tool body includes an arm having slits having dimensions and being disposed on the arm so as to detachably couple with the mating structures of the tool tip. The slits may include an opening with rounded corners for receiving the mating structures, and tapered side walls for frictionally fitting the mating structures. The present invention relates also to a connection system for connecting a micro-dimensional tool body to a changeable micro-dimensional tool tip and to a manipulation tool for use with changeable tool tips of the present invention.

10 Claims, 8 Drawing Sheets

(51) Int. Cl.
*B81C 3/00* (2006.01)
*H01J 37/20* (2006.01)
*B25J 15/12* (2006.01)

(52) U.S. Cl.
CPC .............. *B81C 3/008* (2013.01); *H01J 37/20* (2013.01); *B25J 15/12* (2013.01); *B81B 2201/12* (2013.01); *B81B 2201/13* (2013.01); *H01J 2237/206* (2013.01); *H01J 2237/208* (2013.01)

(58) Field of Classification Search
USPC .................................. 483/16; 294/99.1, 99.2
See application file for complete search history.

(56) References Cited

U.S. PATENT DOCUMENTS

| | | | |
|---|---|---|---|
| 5,899,513 A | 5/1999 | Grisoni | |
| 6,676,416 B1 | 1/2004 | Ellis et al. | |
| 6,923,669 B1 | 8/2005 | Tsui et al. | |
| 7,018,575 B2 | 3/2006 | Brewer et al. | |
| 7,096,568 B1 | 8/2006 | Nilsen et al. | |
| 7,461,882 B2* | 12/2008 | Choi | B25J 7/00 294/100 |
| 7,622,813 B2 | 11/2009 | Brewer | |
| 7,900,336 B2 | 3/2011 | Akinwande et al. | |
| 2004/0135388 A1* | 7/2004 | Sgobero | A61B 17/30 294/100 |
| 2005/0275232 A1* | 12/2005 | Horie | B25J 15/0206 294/86.4 |
| 2006/0043749 A1* | 3/2006 | Huang | B25J 7/00 294/99.1 |

OTHER PUBLICATIONS

Leang, Kim K, and Taylor, Curtis R., A Multifunctional SPM Probe with Modular Quick-Change Tips for Automated Nanofabrication: Preliminary Design and Fabrication, Proceedings of NSF Engineering Research and Innovation Conference, 2009.

Clevy, Cedric et al, A Micromanipulation cell including a tool changer, J. Micromech Microeng, Jan. 14, 2005, p. 292-301, v15, IOP Publishing Ltd., UK Weck, M. and Peschke, C., Equipment technology for flexible and automated micro-assembly, Microsystem Technologies. 2004, p. 241-246, Springer-Verlag.

Kumar, R. et al, Nanobits: Customizable Scanning Probe Tips, Nanotechnology, 2009, p. 1-6, v20, IOP Publishing Ltd, UK.

* cited by examiner

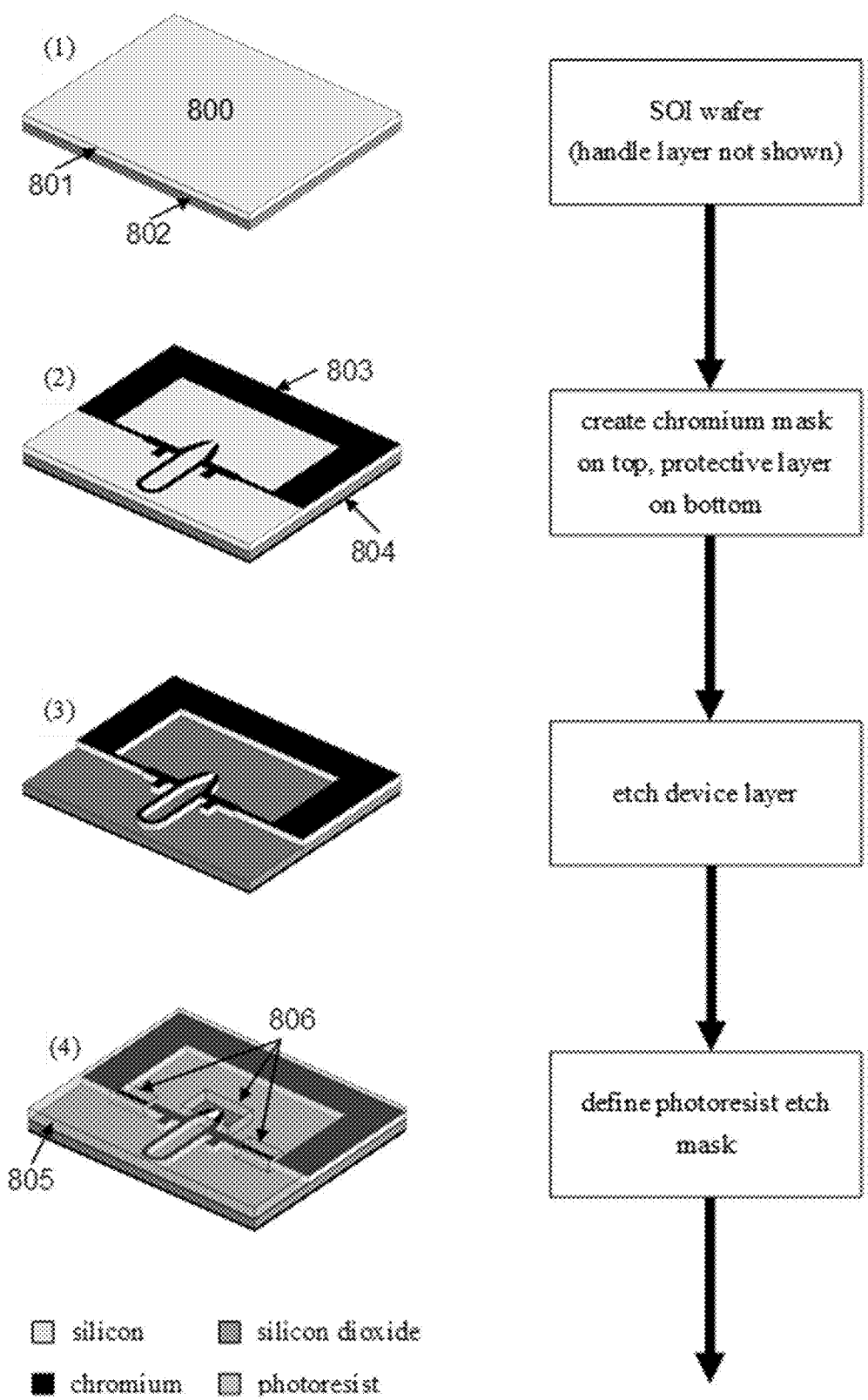
Figure 8 (continues next page)

MICRO-NANO TOOLS WITH CHANGEABLE TIPS FOR MICRO-NANO MANIPULATION

CROSS REFERENCE TO RELATED APPLICATIONS

This application is a national stage application under 35 U.S.C. 371 of International Application No. PCT/CA2012/000508, filed Jun. 1, 2012, which in turn claims the benefit under 35 U.S.C. 119(e) of U.S. provisional Ser. No. 61/493,168, filed Jun. 3, 2011, the contents of each of which are hereby incorporated by reference into the present disclosure.

FIELD OF THE INVENTION

This invention relates to micro/nano tools with changeable tips for micro/nano manipulation, and more particularly relates to modular systems of a micro/nano tool with changeable tool tips for quick and reliable tool tip customization for micro/nano manipulation.

BACKGROUND OF THE INVENTION

Micro-nano manipulation tools, such as those constructed by micro-nano fabrication, including microelectromechanical systems (MEMS) based manipulation tools, have found a range of applications in various fields. These miniaturized tools extend the dexterity of human operators and enable physical interactions for material characterization, in-situ sample preparation and manipulation, as well as for the prototyping of novel micro and nano devices. These micro-nano tools can be applied to assemble nano-scaled structured into a device or system (e.g., NEMS).

The majority of MEMS based manipulation devices are constructed as a single piece, where the structural, actuating, and sensing components of the device are all physically interconnected. This configuration, however, has several disadvantages in the following aspects:

(1) Tool Customization

With the entire MEMS device fabricated as a single piece, any design modification would require the entire tool to be refabricated. In the case of MEMS based manipulation tools, tool tips are often customized according to a specific application. Typical changes in tool tips include size, shape, material, and surface treatments, while the rest of the device body remains unchanged. This customization process is highly inefficient.

(2) Tool Lifetime

The tool tip is the only part of a tool that makes physical contact with objects and surfaces to be manipulated. The tool tip is, therefore, subject to excessive bending, wear, and contamination during use. When damage is incurred on the tool tip, the entire manipulation tool is dicarded and replaced. The time and cost to replace and repackage a new device can be significant.

(3) Application Complications

Manipulation of sub-micrometer-sized objects with MEMS tools is often performed within a high vacuum chamber, such as inside a scanning electron microscope (SEM) or transmission electron microscope (TEM). Such settings require the operator to open the high vacuum chamber for every tool change. Frequent opening of the high vacuum chamber causes long pumping time and concerns of contamination to the vacuum chamber and the experimental setup. The air flow during venting and pumping of the vacuum chamber could also disturb pre-assembled structures.

To overcome these difficulties, a modular design approach may be desirable, in which various tool tips may be constructed separately from the tool body which contains sensors and actuators. A tool tip may then be selected and assembled to the tool body for a given task.

This modularized design concept was previously demonstrated for the construction of atomic force microscopy (AFM) scanning probe (see R. T. Rajendra Kumar, S. U. Hassan, O. Sardan Sukas, V. Eichhorn, F. Krohs, S. Fatikow, and P. Boggild, "Nanobits: customizable scanning probe tips," *Nanotechnology*, vol. 20, 395703, 2009). These probe tips were microfabricated and individually assembled onto an AFM cantilever. The tool tips, however, cannot be made thinner without reducing the structural integrity, which in turn makes the assembly process difficult. The proposed method is also not transferable to the assembly of gripping tool tips onto tool body, which requires nanometer alignment accuracy between the two ends of gripping tool tips.

The assembly of compliant gripping tool tips onto a tool body using various mechanical based mating mechanisms was demonstrated in the past. This includes the use of piezo actuators to lock onto and transfer grasping motion to microgripping tool tips (see M. Week, and C. Peschke, "Equipment technology for flexible and automated microassembly," *Micro Microsystem Technologies*, vol. 10, pp. 241-246, 2004). U.S. Pat. No. 7,461,882 also discloses a microgripper design, where the linear motion of a tool body is translated into grasping motion of modularized tool tips through unique mechanical assembly. Both proposed designs can enable the manipulation of objects of tens of micrometers or larger. The design approaches are not scalable for sub-micrometer object manipulation.

The assembly of modularized components using adhesives has also been demonstrated for constructing manipulation tools. Commercially available microtweezers were assembled through the use of permanent adhesives (see http://www.memspi.com/). Similarly, reversible bonding between the gripping tips and piezoelectric actuator tool body using thermal glue was demonstrated (see C. Clevy, A. Hubert, J. Agnus, N. Chaillet, "A micromanipulation cell including a tool changer," *J. Micromechanics and Microengineering*, vol. 15, pp. S292-S301, 2005). Both of these approaches rely on manual assembly of micro parts, which is time consuming and produce inconsistent assembly results. Misalignments between the assembled gripping tips also prevent secured grasping of small objects, limiting their applications to manipulating objects tens of micrometers and above in size.

A number of patent documents exist focusing on individual aspects of micro scale assembly, which are the key enablers of creating modularized manipulation tools with changeable tips. U.S. Pat. Nos. 5,806,152, 6,398,280, 6,561,725, 6,672,795, 6,837,723, 6,923,669, 7,012,491, 7,025,619, 7,081,630, 7,240,420, 7,314,382 and 7,895,885 disclose specific structural designs that enable mating between microcomponents. Features include reversible mating, zero insertion forces, and integrated actuators. U.S. Pat. Nos. 7,018,575, 7,622,813 and 7,900,336 disclose approaches for improving alignment accuracy between microcomponents during the assembly process. U.S. Pat. Nos. 6,676,416, 6,923,669 and 7,096,568 disclose methods of establishing electrical connections between microcomponents.

The above patent documents each disclose one possible solution aiming to solve one certain aspect of the difficult problem of assembling micro-nano components. No solution exists which is capable of constructing a functional modular micro-nanomanipulation tool. What is needed is a design satisfying the following requirements: (1) quick and repeatable assembly and disassembly between tool body and tool tips; (2) consistent performance of assembled tool; (3) compatible with a wide range of tool tip designs (e.g., probes, grippers); (4) efficient transfer of mechanical forces, electrical signals, and thermal energy between tool body and tool tip; (5) assembly and disassembly to be done in-situ without disturbing the operating environment (e.g., vacuum); (6) amenability to robotic automation; (7) capability of manipulating objects from micrometers down to tens of nanometers in size.

SUMMARY OF INVENTION

The present invention discloses a MEMS approach in the design and microfabrication of modularized manipulation tool with changeable tool tips for quick and reliable tool tip customization for micro-nanomanipulation.

As such, in one embodiment the present invention relates to a modular system for micro-nano manipulation of objects. The modular system, in one embodiment, comprises: (a) a changeable tool tip configured for manipulating objects having micro or nanometer sizes, said changeable tool tip comprising (i) an end effector and (ii) a first mating member; and (b) a tool body, said tool body comprising an arm, the arm including a second mating member having dimensions and being disposed on the arm so as to detachably couple with the first mating member of the tool tip.

In one embodiment of the modular system of the present invention the first mating member comprises coupling means extending from the changeable tool tip, and wherein said second mating member comprises a slit disposed on the tool body, said slit configured for detachably receiving at least a portion of the coupling means.

In another embodiment of the modular system of the present invention the second mating member comprises a coupling means extending from the changeable tool tip, and wherein said first mating member comprises a slit disposed on the tool body, said slit configured for detachably receiving at least a portion of the coupling means.

In another embodiment of the modular system of the present invention the slit includes tapered side walls.

In another embodiment of the modular system of the present invention the tool body further comprises an active releasing system, said active releasing system configured for releasing a tool tip detachably coupled to the tool body.

In another embodiment of the modular system of the present invention the first and second mating members are provided with mating interfaces so as to allow transfer of mechanical forces, electrical signals or thermal energy between the tool body and the tool tip.

In another embodiment of the modular system of the present invention the changeable tool tip is included in a tool rack, said tool rack comprising an array of tool tips.

In another embodiment of the modular system of the present invention the array of tool tips are tethered to the tool rack.

In another embodiment of the modular system of the present invention the end effector comprises a gripper, said gripper having two complementary arms configured for grasping micro- or nano-sized objects, and wherein said arms are connected at one fixed end.

In another embodiment of the modular system of the present invention the changeable tool tips are less than about 100 micrometers in size.

In another embodiment of the modular system of the present invention the tool tip further includes a base, wherein the first mating member comprises a structural means disposed on one side of the base and wherein the end effector extends form another side of the base.

In another embodiment of the modular system of the present invention the first mating member is disposed on the arm of said tool body and said second mating means is disposed on said changeable tool tip.

In another embodiment of the modular system of the present invention the tool tip is constructed from a single material layer.

In another embodiment of the modular system of the present invention the material layer is selected form silicon, silicon dioxide, silicon nitride, polymers, and metals, or combinations of them.

In another embodiment of the modular system of the present invention the end effector is less than 1 micrometer in thickness, and the tool tip is constructed using additional material layers in selected regions of the tool tip.

In one embodiment, the present invention relates to a connection system for connecting a micro-dimensional tool body to a changeable micro-dimensional tool tip. The connection system, in one embodiment, comprises coupling means extending from the changeable tool tip and a slit disposed on the tool body, said slit configured for detachably receiving at least a portion of the coupling means.

In one embodiment of the connection system of the present invention the coupling means extend from the tool body and the slit is disposed on said changeable tool tips.

In another embodiment of the connection system of the present invention the slit includes tapered side walls.

In one embodiment, the present invention relates to a tool rack. The tool rack, in one embodiment, comprises an array of micro-dimensional changeable tool tips, each of said micro-dimensional tool tips including (i) an end effector configured for manipulating objects having micro or nanometer sizes, and (ii) a mating member for detachably connecting the tool tip to a tool body.

In one embodiment of the present invention, the tool rack includes tethering beams for connecting the micro-dimensional changeable tool tip to the tool rack, said tethering beams configured such that upon connection of the mating member of said tool tip to the tool body said tethering beams break thereby releasing the connected tool tip from the tool rack.

In one embodiment, the present invention relates to a manipulation tool for use with changeable tool tips. The manipulation tool, in one embodiment, comprises: (a) tool tips, and (b) a tool body, the tool body comprising lateral arms including a mating member for detachably coupling with said tool tips, and an mechanism for actively releasing tool tips from the receiving means, wherein individual tool tips can be selectively coupled onto the mating member of the lateral arms, and wherein individual tool tips can be disassembled from the tool body by using the active releasing mechanism.

In one embodiment of the manipulation tool of the present invention the tool tips are tethered to a tool rack, forming arrays of tool tips.

In another embodiment of the manipulation tool of the present invention the tool rack includes different types of tool tips.

In another embodiment of the manipulation tool of the present invention the tool tips are constructed from a single material layer.

In another embodiment of the manipulation tool of the present invention the material layer selected from silicon, silicon dioxide, silicon nitride, polymers, and metals, or combinations of them.

In another embodiment of the manipulation tool of the present invention the tool tips have dimensions less than 100 micrometers in size.

In another embodiment of the manipulation tool of the present invention the tool tips include sections having less than one micrometer in thickness and sections having more than one material layers.

In another embodiment of the manipulation tool of the present invention the coupling between the tool tip and tool body is based on enhanced frictions at contact interfaces.

In another embodiment of the manipulation tool of the present invention the mating interfaces between the tool tip and tool body allow transfer of mechanical forces, electrical signals, thermal energy or combination thereof.

In an embodiment of the present invention, batch fabricated MEMS tool tips can be individually selected and reversibly assembled onto a MEMS tool body. The assembly method involves enhancing friction at mating interfaces, allowing reliable transfer of mechanical forces, electrical signals, and thermal energy between tool body and tool tip.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

BRIEF DESCRIPTION OF THE DRAWINGS

The invention will be better understood and objects of the invention will become apparent when consideration is given to the following detailed description thereof. Such description makes reference to the annexed drawings wherein:

FIG. 4 (b) is a zoom-in view of FIG. 4 (a) illustrating slits on tool body for tool tip insertion in accordance with one embodiment of the present invention.

FIGS. 6 (e)-(f) are SEM images illustrating a sequence for the tool tip removal from a slit in accordance with one embodiment of the present invention.

Figure 1:
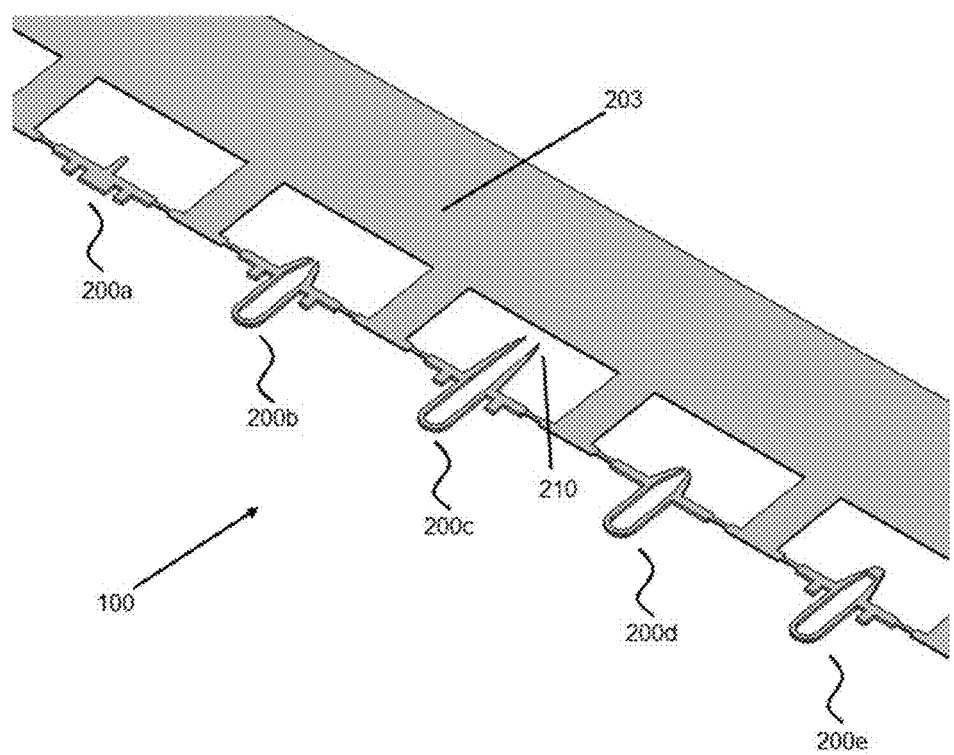
FIG. 1 is a scanning electron microscope (SEM) image of a perspective view of an array of tool tips in accordance with one embodiment of the present invention.

In the drawings, embodiments of the invention are illustrated by way of example. It is to be expressly understood that the description and drawings are only for the purpose of illustration and as an aid to understanding, and are not intended as a definition of the limits of the invention.

DETAIL DESCRIPTION OF THE INVENTION

Unless defined otherwise, all technical and scientific terms used herein have the same meaning as commonly understood by one of ordinary skill in the art to which this invention belongs. Also, unless indicated otherwise, except within the claims, the use of "or" includes "and" and vice-versa. Non-limiting terms are not to be construed as limiting unless expressly stated or the context clearly indicates otherwise (for example "including", "having" and "comprising" typically indicate "including without limitation"). Singular forms including in the claims such as "a", "an" and "the" include the plural reference unless expressly stated otherwise.

The present invention, in one embodiment, is a modular manipulation system with changeable tool tips, which may allow quick and reliable tool tip assembly and disassembly. The modular manipulation system may be a microelectromechanical-based system. The present invention overcomes the drawbacks of existing modular tool designs (assembly alignment accuracy, assembly efficiency, and incapability for further miniaturization), by allowing a single tool body to be used for manipulating objects ranging from hundreds of micrometers down to nanometers in size by using tool tips with appropriate shapes and sizes comparable to those of objects to be manipulated.

As such, in one embodiment the present invention relates to a modular system for micro-nano manipulation of objects. The modular system, in one embodiment, comprises: (a) a changeable tool tip configured for manipulating objects having micro or nanometer sizes, the changeable tool tip comprising (i) an end effector and (ii) a first mating member; and (b) a tool body, the tool body comprising an arm, the arm including a second mating member having dimensions and being disposed on the arm so as to detachably couple with the first mating member of the tool tip.

In other embodiments the present invention relates also to a connection system for connecting a micro-dimensional tool body to a changeable micro-dimensional tool tip, to a tool rack having an array of micro-dimensional changeable tool tips and to a manipulation tool for use with changeable tool tips.

FIG. 1 illustrates an array 100 of tool tips 200 in accordance with one embodiment of the present invention. Tool tips 200 may be fabricated as part of an array 100 of tool tips

200. As such, array 100 may include a plurality of tool tips 200. FIG. 1 illustrates five tool tips 200*a-e*. More or less than five tool tips may be included in an array. Each tool tip 200 in array 100 may have different shapes and sizes, such as gripping tool tips and probes.

Figure 2:
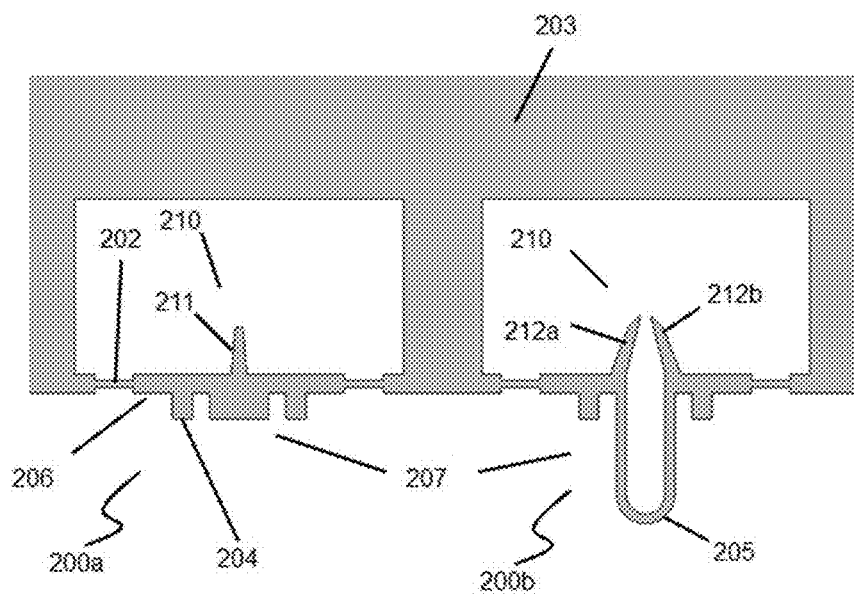
FIG. 2 illustrates a top view showing the different features of a probing tool tip in accordance with one embodiment of the present invention and a gripping tool tip in accordance with one embodiment of the present invention.

FIG. 2 represents a schematic close-up view of tool tips 200*a* and 200*b* of array 100 shown in FIG. 1. With reference to FIG. 2, the tool tips 200 of the present invention may include end tips or end effectors 210 and mating members 204.

End effectors 210 may extend from base 207. End tips may take on a number of designs. FIG. 2 illustrates a single ended effector 211 (e.g., probe) and multi-ended effector 212*a*, 212*b* (e.g., gripper). Examples of end effectors include scissors, scalpels, mechanical needles, electrical testing needles, pipettes, spatulas, forks, grippers, probes and so forth.

Coupling means, such as mating members 204 may be disposed on a surface on one side of the base 207. In one embodiment, mating members may be disposed on one side of the base and the end effector may extend from another side of the base. Mating members 204 may be designed to correspond to mating structures on a tool body configured for detachably coupling with the mating members 204, as explained herein below.

In one embodiment of the present invention, base 207 may include means for connecting the tool tips to the tool rack, such as tethering beams 202 which may connect a tool tip 210 onto tool rack 203. In the case of tool tips having multi-end effectors, the base may also include means for connecting the end effectors. For example tool tip 200*b* includes spring flexures 205 which may serve to connect the two ends 212*a* and 212*b* of a tool tip 200*b* together.

With reference to FIG. 2, base 207 may further include side arms 206, which may serve to connect the tethering beams 202 to the tool tip 210. Mating members 204 may extend from side arms 206 of base 207. Mating members 204 may extend from side arms in a direction opposite to the end effector 210.

With reference to FIG. 2, for gripping tool tips, compliant spring structure 205 may be used to connect the two gripping arms 212*a*, 212*b* together. This configuration may eliminate the need to assemble and manually align each gripping arm separately onto the tool body, effectively reduce sources of error during assembly, and improve assembly efficiency.

Figure 3:
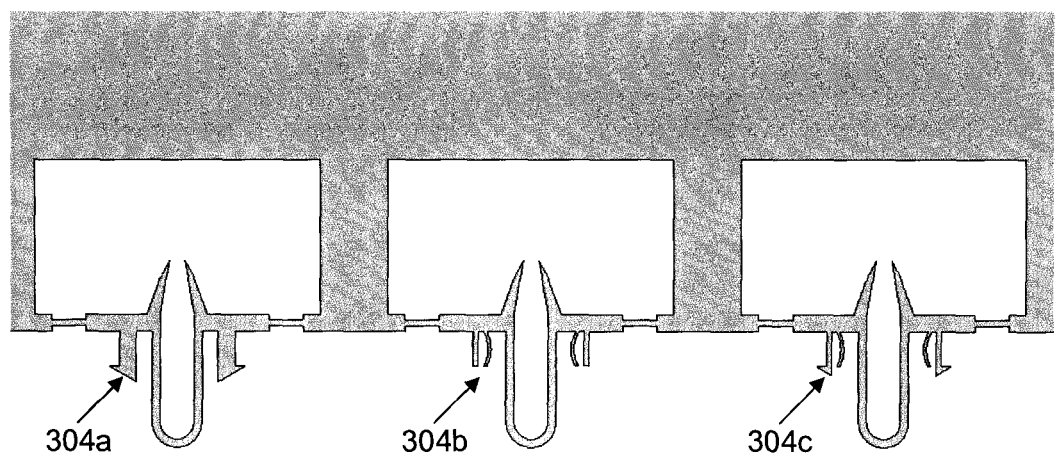
FIG. 3 illustrates a top view of mating structures on the tool tip in accordance with one embodiment of the present invention, including (a) cantilever with barbed end, (b) spring loaded designs, or (c) combinations of barb end and spring loaded designs.

With reference to FIG. 2, mating members 204 may be simple cantilevers which may be press fitted into matching slits on the tool body. It should be understood to a skilled person in the art that other types of friction based mating structures may also be possible and within the scope of the present invention. FIG. 3 shows a few other examples of mating members 204, including (a) cantilever with barbed end 304*a*, (b) spring loaded designs 304*b*, or (c) combinations 304*c* of the two (a) and (b).

A tool body which may be used in aspects of the present invention includes a modified version of microgrippers previously disclosed in WO/2010/094102, the contents of which are incorporated herein by reference.

Figure 4:
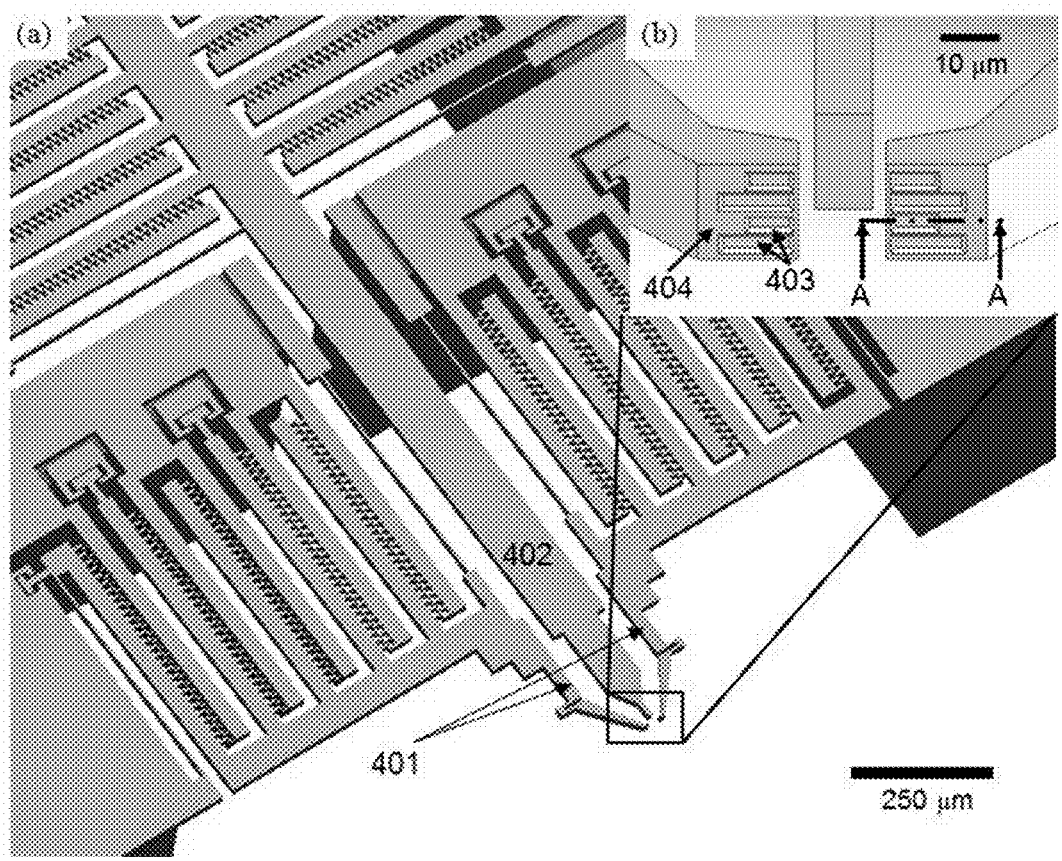
FIG. 4 (a) is a SEM image illustrating a perspective view of a tool body in accordance with one embodiment of the present invention.

Referring to FIG. 4 illustrated is a scanning electron microscope (SEM) image of a microdimensional tool body 400 in accordance to one embodiment of the present invention. The tool body 400 may include one or more arms 401. The one or more arms of the tool body may be laterally moving. Tool body 400 may also include an active release system, such as plunger 402, which may be located in between arms 401*a,b*. Plunger 402 may be capable for moving forward and backward. The tool body may be attached to an external positioning system that provides XYZ motions and also possibly rotations. As such, once a tool tip is assembled onto the tool body, probing movements and movements for grasping, scissoring and so forth may be done.

In the embodiment of FIG. 4, arms 401*a,b* and the plunger 402 are actuated by lateral comb-drive microactuators 407. However, it should be understood that other types of electrostatic actuators, electrothermal actuators, or other types of microactuators in combination with motion/force amplification/reduction mechanisms are possible and within the scope of the present invention.

Lateral arms 401*a,b* may include a top having a side wall 404, as illustrated in FIG. 4(*b*). One or more mating structures 403 configured for detachably receiving the mating members of tool tips may be included on each side wall 404 of lateral arms 401. Mating structures 403 may take the form of slits. Although FIG. 4 (*b*) illustrates several slits per arm, it is understood that one slit per arm may be sufficient to secure one tool tip 200. Slits 403 may be created by focused ion beam (FIB) onto the sidewalls of the two arms 401. Each of the one or more slits 403 may be configured for providing corresponding assembly sites for a mating coupling structure of a tool tip. As such, slits 403 may have dimensions that may permit secured, detachable assembly of a mating structure of tool tips of the present invention.

For convenience, and without defining an order or importance, the mating member of the tool tip will be referred to as a first mating member, and the mating structure of the tool body may be referred to as a second mating member.

Figure 5:
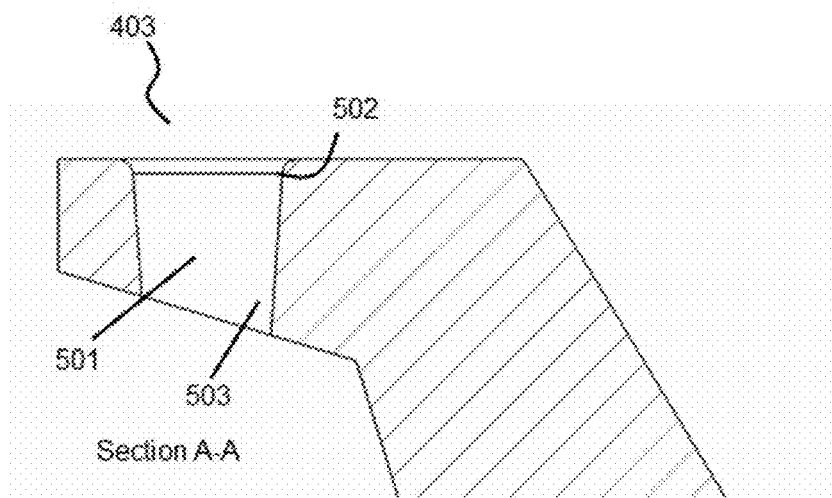
FIG. 5 illustrates the cross sectional view of a slit for tool tip insertion in accordance with one embodiment of the present invention, taken from cross section A-A shown in FIG. 4 (b).

Referring to FIG. 5 with continued reference to FIGS. 2 and 4, illustrated is the cross sectional profile of a slit 403. In one embodiment of the present invention, slit 403 may include an opening 501, which may include means for facilitating engagement of the coupling structure of the tool tip. In one embodiment, the means for facilitating engagement of the coupling structure of the tool tip may be rounded corners 502 which may allow the mating member of the tool tip to easily align and slip into slit 403. In one embodiment, the walls 503 of slit 403 may be tapered, gradually decreasing slit size which may provide tighter frictional fitting for mating member of the tool tip. It should be understood that walls of slits may not be tapered and other features of slits may be created to enhance frictional forces at contact interfaces, and are covered within the scope of the present invention.

In another embodiment of the present invention, slits and mating structures may reverse their position. In this embodiment of the invention the mating structures may be disposed on the tool body, and the corresponding slits may be disposed on the tool tips. For example, each of the two side arms shown in FIG. 4 may take the form of mating structures, while the corresponding matching slits may be disposed on the side arms of tool tips. As such, in one embodiment, the first mating member and the second mating member may adapted to be detachably joined together by inserting at least a portion of said first mating member into at least a portion of said second mating member. In another embodiment, the first mating member and the second mating member may adapted to be detachably joined together by inserting at least a portion of the second mating member into at least a portion of the first mating member.

Figure 6:
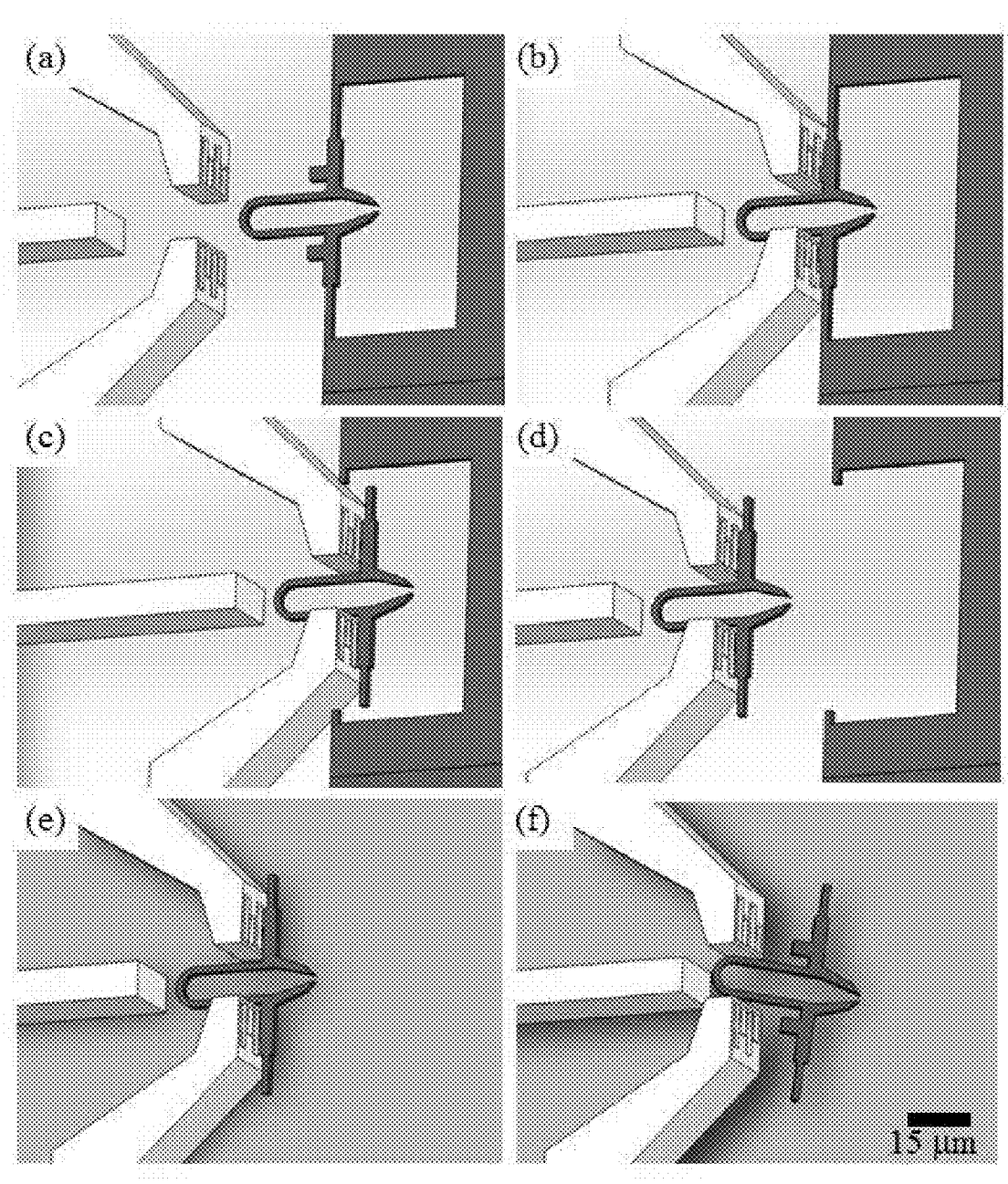
FIG. 6 (a)-(d) are SEM images illustrating a sequence for the tool tip insertion into a slit in accordance with one embodiment of the present invention.

Referring to FIG. 6(*a*)-(*f*) illustrated herein is an example of a method of tool change sequences in accordance to one embodiment of the present invention. Panels (a) to (d) illustrate the assembly of a tip onto slits of a tool body. Assembly may involve press fitting a selected tip, in this case a gripping tip, directly into the matching slits on the tool body arms (FIGS. 6(a) and 6(b)). Friction may securely hold the tip in place. Tool body movements may break the tethering beams and free the tool tip from the tool-tip array/rack (FIG. 6(c)). This process of assembly between the tool tip and tool body may be completed in less than about one minute via manual operation. This process of assembly may be faster and more convenient than other modular tool assembly designs which rely on adhesives or meticulous assembly alignments. When automated, the assembly process may last only a few seconds. To disengage the tool tip from the tool body (FIG. 6(e)(f)), the middle arm of the tool body may be actuated to push the base of the tool tip out of the slits by overcoming the friction at mating interfaces. This process of active release may only take a fraction of a second to complete. This process may take place inside a SEM.

The assembly of the tool body with tool tip may be done using an external positioner. Such a positioning system provides one or more degrees-of-freedom (e.g., it may move in XYZ directions) with a motion resolution better than 10 micrometers. In one embodiment, the assembly task may involve inserting the mating member of the tool tip into the mating structures on the one or more arms of the tool body using such a positioning system.

Manual assembly may involve the user to operate such a positioning system via a joystick and observe images displayed on a screen to complete the assembly task, as illustrated in FIG. 6. Automated assembly may involve pre-programmed motion and uses feedback (e.g., computer vision feedback, encoder feedback), to automatically complete the assembly task with minimum or no user assistance.

In one embodiment of the present invention for assembly of a tool tip onto slits of a tool body, the array of tool tips may stay stationary. The tool body, having slits on side walls of arms, may be moved in a direction so as to approach a target tool tip which may be tethered to the tool rack/array. As the tool body moves towards the target tool tip, the mating structures on the tip may be inserted into the slits on the side walls of the arms of tool body. The tool body may continue to move in the same direction. Due to the design of the compliant tethers/beams and due to the continued movement of the tool body, the tethering beams may break thereby leaving the tool tip assembled onto the tool body.

Figure 7:
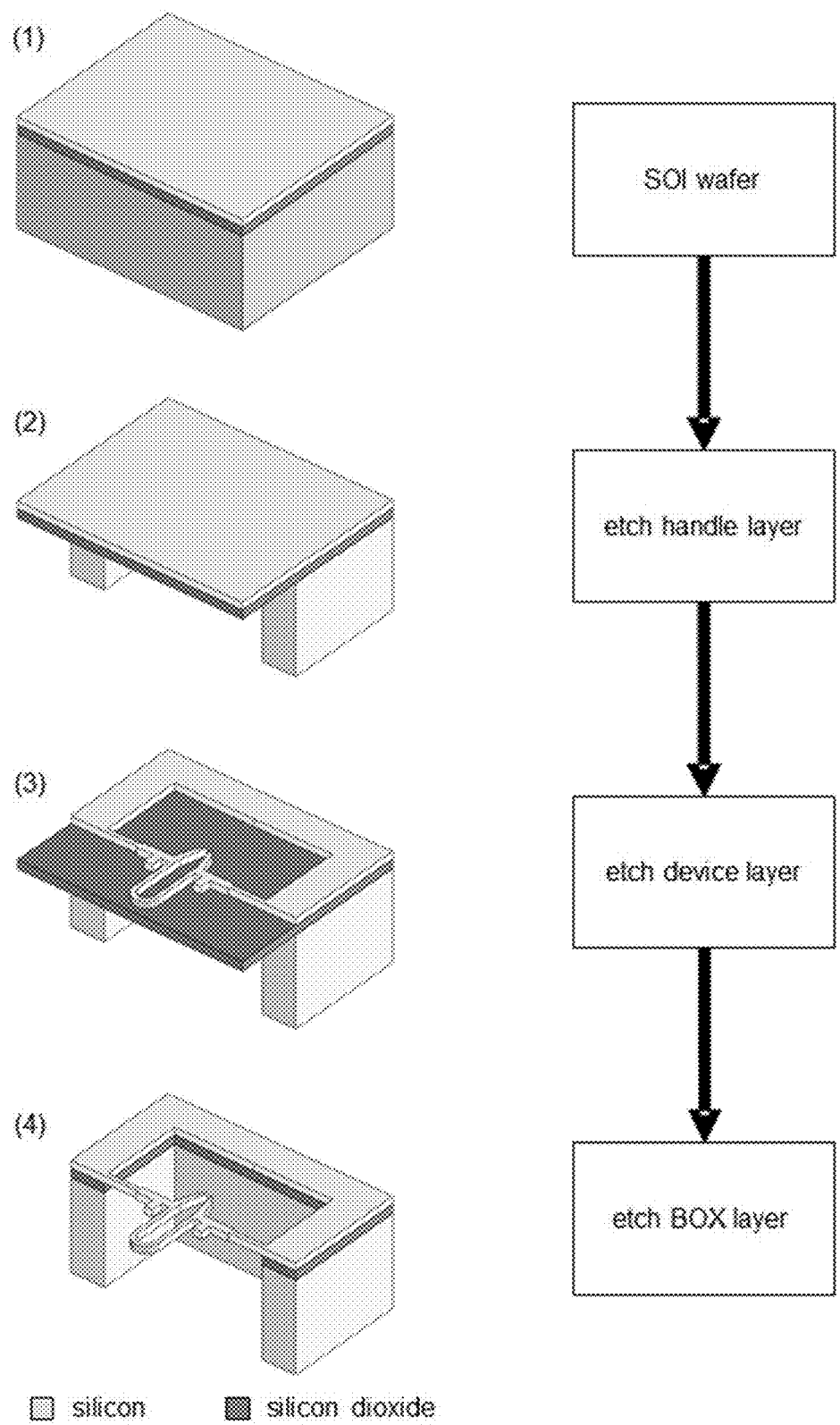
FIG. 7 illustrates a microfabrication process suitable for making tool tips with thickness one micrometer and above in accordance with one embodiment of the present invention.

Tool tips with thickness of about one micrometer and above may be constructed from a single material layer. FIG. 7 shows an example microfabrication process using silicon-on-insulator (SOI) wafers. A person skilled in the art may understand that other microfabrication methods may be used within the scope of the present invention. In one embodiment of the present invention, a microfabrication process may include: (1) Start with an SOI wafer. (2) Handle layer of the wafer may be etched using DRIE (deep reactive ion etching) until the buried oxide layer (photolithographic mask 1). (3) Device layer may be patterned using a second photolithographic mask, and then may be etched using DRIE until the BOX (buried oxide) layer. (4) Wafer may then be immersed in BOE (buffered oxide etchant) to isotropically etch the oxide layer, creating one suspended tool tip or creating suspended tool tip arrays.

For tool tips having constant material thickness throughout the tool tip structure, lateral dimensions of the tool tip may be limited by lithography resolution, while further reduction in overall thickness may result in poor structural aspect ratio which may lead to undesired out-of-plane bending. Miniaturized tool tips may also have poor structural integrity, making the handling and assembly of these parts difficult.

Figure 8:
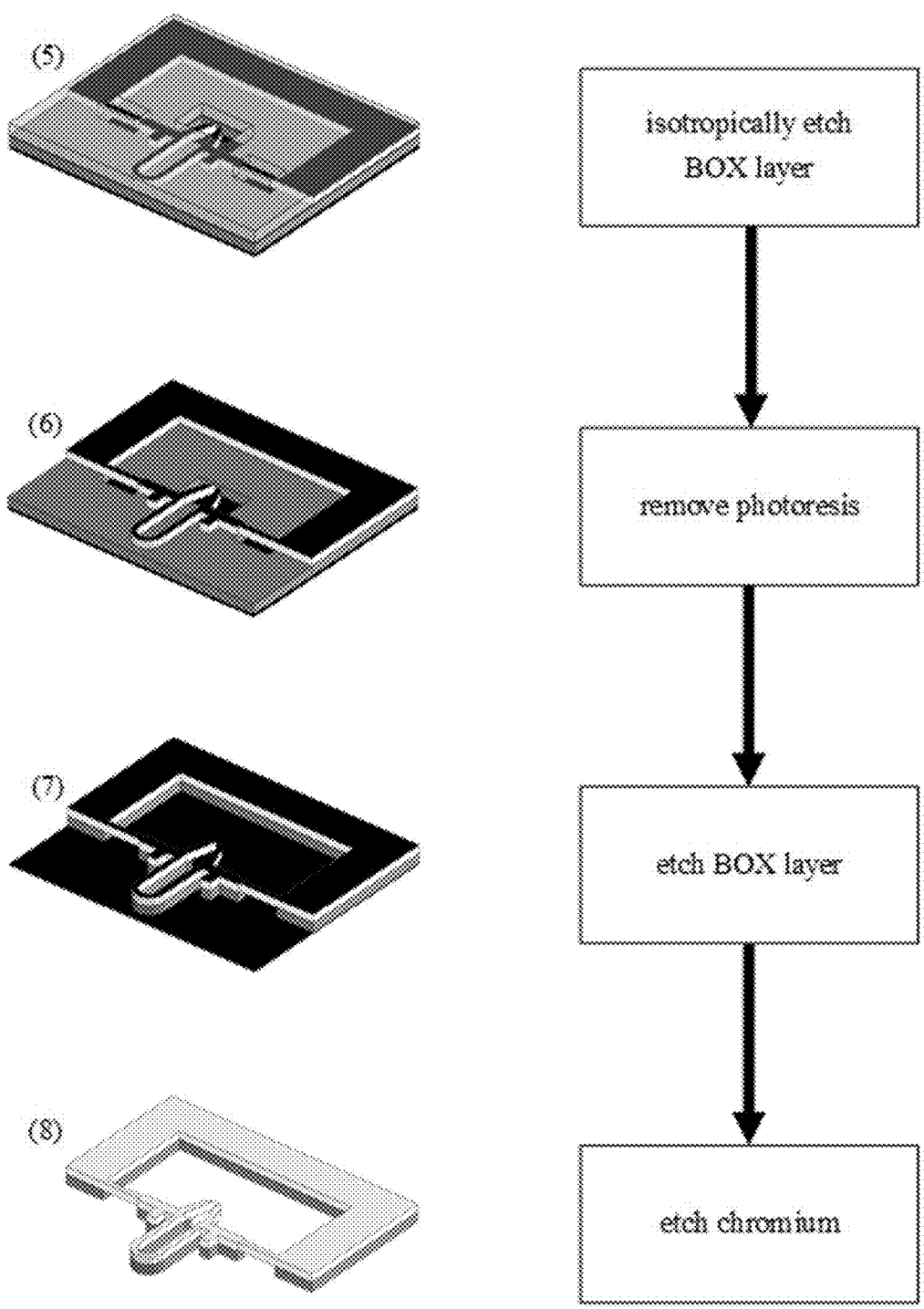
FIG. 8 illustrates a microfabrication process suitable for making tool tips with end thickness below one micrometer in accordance with one embodiment of the present invention.

In one embodiment of the present invention, to maintain the structural functionality of the miniaturized tool tips, additional material layer may be added to selected regions of the tool tips for improving the structural aspect ratio and integrity. This approach may allow the end effectors of tool tip to be miniaturized down to nanometers in thickness while maintaining the structural performance at its mating site to the tool body. An example microfabrication process of a tool tip in a rack using SOI wafer is illustrated in FIG. 8. For clarity purposes only, handle layer of the SOI wafer is omitted in the drawings of FIG. 8. The microfabrication method may include: (1) Start with an SOI wafer 800 having a handle layer, a front device silicon layer 801 and a buried oxide layer 802 (BOX). Handle layer may be patterned with photolithography mask 1 and etched away using DRIB (not shown). (2) Chromium layer 803 may be deposited and patterned on the front side 801 to create etch mask (photolithographic mask 2). A chromium layer 804 may also be deposited on the backside as protective layer. (3) Device layer 801 may be etched using DRIE. (4) Device layer 801 may be patterned using photolithographic mask 3 805 so as to expose selected area 806, including the end effectors. (5) The wafer 800 may be immersed in BOB to isotropically etch the BOX layer below the tool tip ends. (6) The photoresist 805 may be removed using chemical solvent and RIE (reactive ion etching). (7) Exposed BOX layer 802 may be etched using RIE from the top. (8) The wafer may be immersed in wet chromium etchant so as to remove all chromium layers.

Figure 9:
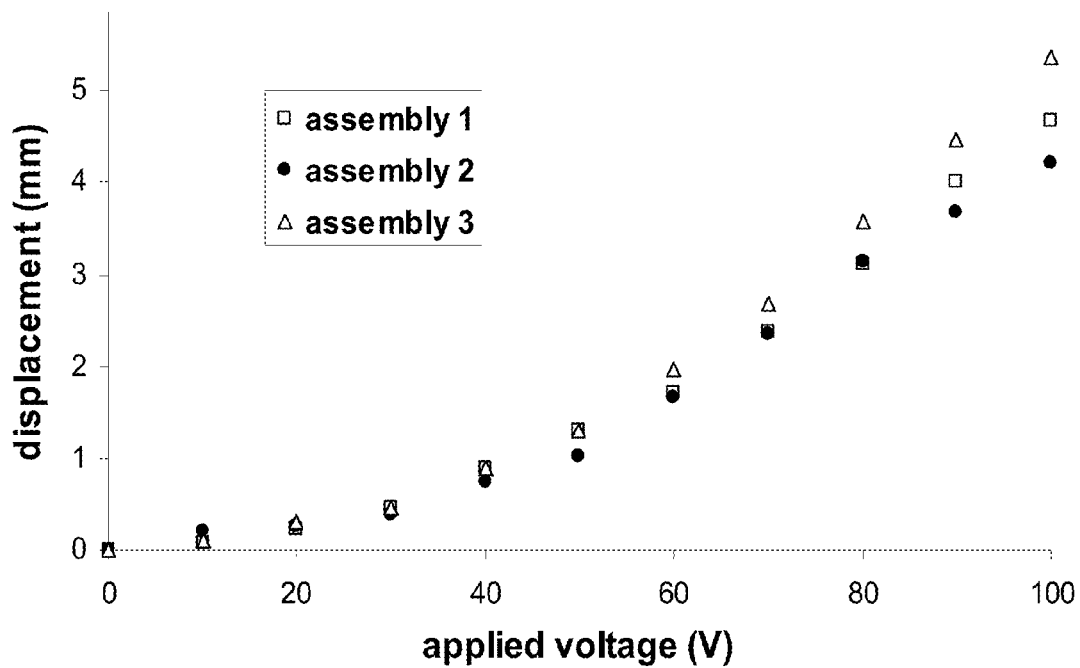
FIG. 9 shows the assembled gripping tips displacement when the tool body is actuated.

FIG. 9 shows measured displacements of three gripping tips of the present invention which were sequentially assembled and disassembled to a tool body inside the SEM. Slight differences in displacements may exist across the gripping tips due to imperfect mating conditions. However, each individual assembly performed consistently with a standard deviation in displacement less than 85 nm (n=30). The secured mating between the parts extends the actuation forces from tool body onto gripping tool tips for grasping. Altering the tool tips material properties or surface coating may also allow electrical signals and thermal energy to be efficiently transferred within the assembly.

Figure 10:
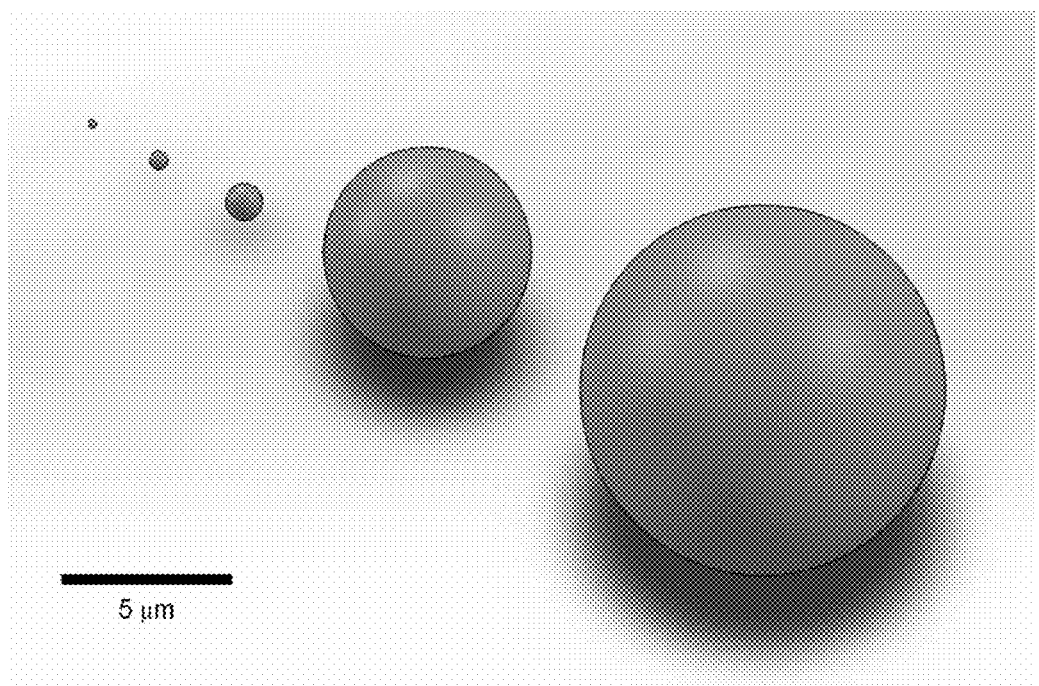
FIG. 10 shows a SEM image of spheres (100 nm, 500 nm, 1 µm, 5 µm, and 15 µm) picked and placed into a line with the modular manipulation tool.

For proof-of-principle demonstration, a microgripper with changeable gripping tips of the present invention was used to pick-place spheres with diameters varying from 100 nm to 15 µm. FIG. 10 shows these cross-scale spheres placed into a line inside SEM. This multi-scale manipulation task was made possible by three times in-situ (without opening of SEM chamber) tool tip change, ensuring that gripping tip was always comparable in dimensions to the spheres that were manipulated. In comparison, using multiple grippers of the prior art would not only require different designs of grippers themselves, but would also require the operator to open the SEM high vacuum chamber for every tool change.

The modular manipulation tool design disclosed in this invention may be extended to a number of applications. It is particularly useful in SEM applications which may require frequent tool tip change (e.g., device probing) and for biological applications where a tip is of single use due to possible cross contamination. It will be appreciated by those skilled in the art that other variations of the one or more embodiments described herein are possible and may be practiced without departing from the scope of the present invention.

The above disclosure generally describes the present invention. Changes in form and substitution of equivalents are contemplated as circumstances may suggest or render expedient. Although specific terms have been employed herein, such terms are intended in a descriptive sense and not for purposes of limitation. It will be appreciated by those skilled in the art that other variations of the preferred embodiment may also be practised without departing from the scope of the invention. As such modifications or variations are believed to be within the sphere and scope of the invention as defined by the claims appended hereto.

We claim:

1. A modular micro-nano manipulation system, wherein said modular system comprises:
   (a) a changeable tool tip, said changeable tool tip comprising
      (i) an end effector, said end effector having two complementary arms configured for manipulating micro-sized or nano-sized objects, wherein said two complementary arms are connected at one fixed end, and
      (ii) a first mating member;
   (b) a tool body, said tool body including
      (i) two lateral arms, wherein each lateral arm includes a respective second mating member, each second mating member being disposed on the tool body so as to frictionally and detachably couple with the first mating member of the changeable tool tip,
      (ii) an active release plunger configured for releasing the changeable tool tip attached to the two lateral arms, the active release plunger being disposed between the two lateral arms, and
      (iii) an electrostatic actuator linked to the two lateral arms and the active release plunger; and
   (c) an external positioning system that provides motion in X, Y, and Z-directions to the two lateral arms.

2. The modular system of claim 1, wherein said first mating member comprises coupling means extending from the changeable tool tip and wherein each of said second mating members comprises a respective slit disposed on the tool body, each of said slits configured for detachably receiving at least a portion of the coupling means.

3. The modular system of claim 2, wherein each of the slits includes respective tapered side walls.

4. The modular system of claim 1, wherein said first mating member and said second mating members are provided with mating interfaces so as to allow transfer of mechanical forces, electrical signals, or thermal energy between the tool body and the changeable tool tip.

5. The modular system of claim 1, wherein said changeable tool tip is included in a tool rack, said tool rack comprising an array of tool tips.

6. The modular system of claim 5, wherein said array of tool tips are tethered to the tool rack.

7. The modular system of claim 1, wherein the end effector comprises a gripper.

8. The modular system of claim 1, wherein said changeable tool tip is less than 100 micrometers in size.

9. The modular system of claim 1, wherein the tool tip further includes a base, wherein the first mating member comprises a structural means disposed on one side of the base and wherein the end effector extends from another side of the base.

10. The modular system of claim 1, wherein the end effector is less than 1 micrometer in thickness.

* * * * *